(12) United States Patent
Mates

(10) Patent No.: US 7,509,548 B2
(45) Date of Patent: Mar. 24, 2009

(54) METHOD AND APPARATUS FOR INTEGRATED CIRCUIT SELF-DESCRIPTION

(76) Inventor: John W. Mates, 8945 NW. Oak St., Portland, OR (US) 97229

( * ) Notice: Subject to any disclaimer, the term of this patent is extended or adjusted under 35 U.S.C. 154(b) by 479 days.

(21) Appl. No.: 10/610,713

(22) Filed: Jun. 30, 2003

(65) Prior Publication Data

US 2004/0268197 A1   Dec. 30, 2004

(51) Int. Cl.
*G01R 31/28* (2006.01)
*G06F 11/00* (2006.01)

(52) U.S. Cl. .................. 714/726; 714/37; 714/732; 714/741

(58) Field of Classification Search ......... 714/724–726, 714/733–734, 26, 30, 33, 37–39, 45–46, 714/741, 732; 716/3–7, 12; 703/14, 17; 365/200, 201
See application file for complete search history.

(56) References Cited

U.S. PATENT DOCUMENTS

| 5,517,637 | A  | * | 5/1996  | Bruce et al. ............... 703/15 |
| 5,642,362 | A  | * | 6/1997  | Savir ......................... 714/726 |
| 6,058,492 | A  | * | 5/2000  | Sample et al. ............... 714/33 |
| 6,059,451 | A  | * | 5/2000  | Scott et al. .................. 714/726 |
| 6,223,312 | B1 | * | 4/2001  | Nozuyama .................. 714/724 |
| 6,230,290 | B1 | * | 5/2001  | Heidel et al. ................ 714/718 |
| 6,237,007 | B1 | * | 5/2001  | Brown ..................... 707/104.1 |
| 6,438,664 | B1 | * | 8/2002  | McGrath et al. ............. 711/154 |
| 6,721,923 | B2 | * | 4/2004  | Fisher .......................... 716/1 |
| 6,807,520 | B1 | * | 10/2004 | Zhou et al. ................... 703/14 |
| 6,834,376 | B2 | * | 12/2004 | Wada ............................. 716/2 |
| 6,907,587 | B2 | * | 6/2005  | Rittman et al. ................. 716/5 |

* cited by examiner

*Primary Examiner*—Phung M Chung
(74) *Attorney, Agent, or Firm*—Blakely, Sokoloff, Taylor & Zafman LLP

(57) ABSTRACT

An integrated circuit includes a self-description data store that stores a self-description of at least a portion of the integrated circuit device. The self-description includes at least some connectivity information indicating a structure of the integrated circuit device. The integrated circuit self-description may be referred to as a circuit netlist attachment or CNA.

26 Claims, 3 Drawing Sheets

US 7,509,548 B2

METHOD AND APPARATUS FOR INTEGRATED CIRCUIT SELF-DESCRIPTION

BACKGROUND

An embodiment of the present invention relates to the field of integrated circuits and, more particularly, to an approach for integrated circuit self-description.

When debugging or otherwise analyzing an integrated circuit, it is typically desirable to have access to detailed documentation and/or information regarding the integrated circuit's design and operation in order to create targeted tests, for example. Such documentation and other information is conventionally provided in written form or stored on a mass storage device such as a network-accessible disk drive.

An issue may arise, however, if the appropriate documentation or information is not easily locatable. For example, if there are multiple iterations of a particular product, it may not be straightforward to determine which of a variety of documents applies to the product to be analyzed. Other issues may arise in terms of accessing documentation for products that have been in production for a period of time and associated documentation and information is not archived properly.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for integrated circuit self-description is described. In the following description, particular types of integrated circuits and sub-circuits, for example, are described for purposes of illustration. It will be appreciated, however, that other embodiments are applicable to other types of integrated circuits, and to sub-circuits configured in another manner.

For one embodiment, an integrated circuit includes a self-description data store that stores a self-description of at least a portion of the integrated circuit device, the self-description to include at least some connectivity information indicating a structure of the integrated circuit device. The integrated circuit self-description may alternatively be referred to herein as a circuit netlist attachment or CNA.

Details of this and other embodiments are provided in the description that follows.

Figure 1:
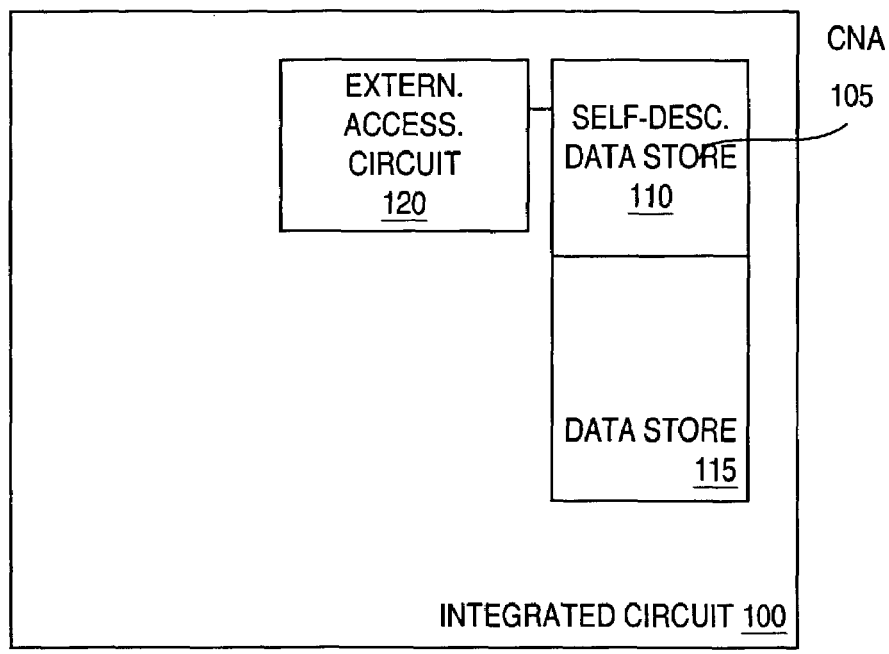
FIG. 1 is a block diagram illustrating an integrated circuit device including a circuit netlist attachment of one embodiment.

FIG. 1 is a high-level block diagram showing an integrated circuit 100 of one embodiment including a circuit netlist attachment (CNA) 105 stored in a self-description data store 110. As such, the CNA is essentially a sub-circuit of the integrated circuit it describes. The integrated circuit 100 may be a microprocessor, for example, or any other type of integrated circuit device.

Circuit netlist attachment or CNA as the terms are used herein refer generally to a self-description of an integrated circuit or portion of an integrated circuit that includes at least some connectivity and/or structural information and that is provided on the integrated circuit itself. The CNAs described herein may be considered netlists or formal descriptions of the elements of circuits and their connectivity patterns, for example.

The CNA 105 of various embodiments may or may not include a complete netlist and/or complete connectivity information. For some embodiments, for example, for integrated circuits that are similar except for a particular feature set or group of circuits, the differences may be distinguished by variations in their CNAs. In this manner, CNAs may provide an interesting approach for hiding the function of a host circuit so as to disguise the meanings and behaviors of its pins or other important nodes in the circuit.

The CNA may also include other information associated with a host circuit, such as functionality or behavioral information, identification information, feature identification, etc. The level of detail provided in a CNA may be determined by a designer, for example, and may range from descriptions associated with only a few circuits to providing enough information to simulate the entire circuit behavior at the level of abstraction of the description language used to provide the CNA.

Additionally, for some embodiments, the CNA may even document/describe itself. For such embodiments, the CNA may simply indicate the size of the CNA, for example. Alternatively, the CNA may indicate size, location of portions of CNA, and/or a checksum, for example.

For some embodiments, particularly for reliability-sensitive applications, multiple copies of a CNA may be provided. For one embodiment, one copy of a CNA may include a pointer to another copy of the CNA that is also stored on-chip and is a redundant copy or a ones complement of the first copy, for example. For this example, the redundant or ones complement copy of the CNA may be used to provide a reliable, self-correcting CNA.

Other types of information may be included in a CNA self-description for other embodiments.

The CNA 105 may be stored in the self-description data store 110 in any manner that provides for subsequent retrieval, parsing and utilization of the associated information.

Figure 2:
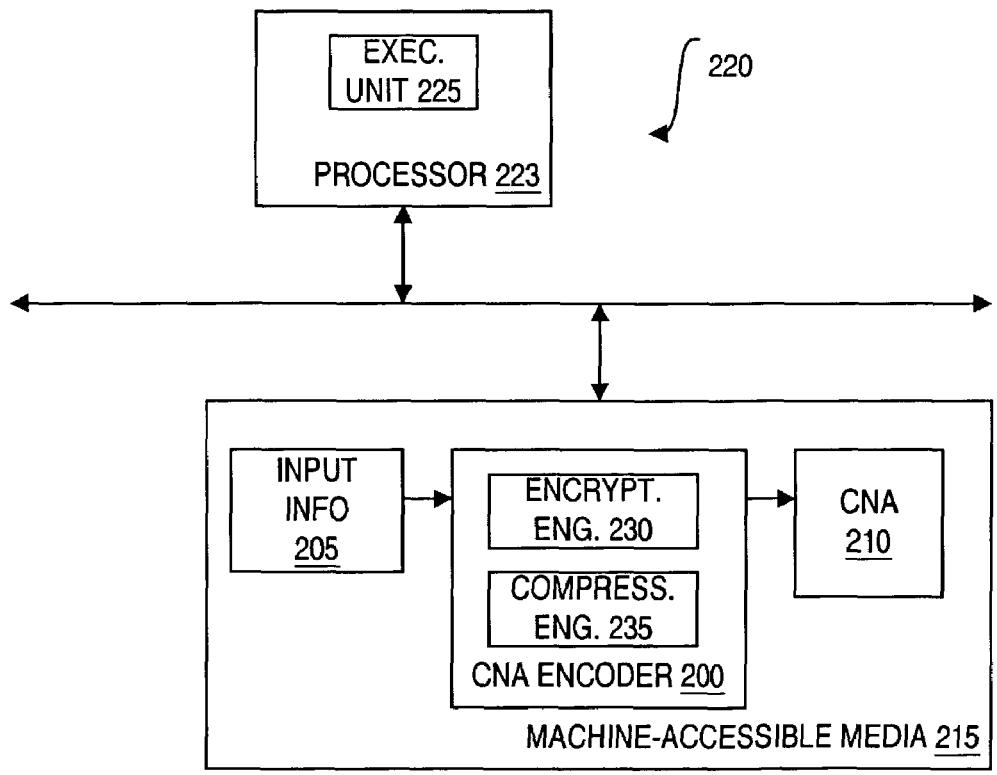
FIG. 2 is a high-level block diagram showing a CNA encoding approach of one embodiment.

For example, referring to FIG. 2, for one embodiment, a CNA encoder 200 may receive a netlist or other descriptive information 205 associated with the integrated circuit of interest and provide as output an encoded CNA 210 suitable for storage on the integrated circuit of interest. The output 210 may be in a form that is usable to write data onto the integrated circuit of interest after manufacture using a conventional data storage approach. Alternatively, the output 210 may be in a form that is usable to develop a mask set to manufacture the integrated circuit with the CNA information provided thereon using an approach similar to that used to provide microcode ROM, for example. Other approaches for providing the CNA on the host integrated circuit are within the scope of various embodiments.

With continuing reference to FIG. 2, the CNA encoder 200 may be implemented in a variety of different ways depending on the desired format and detail of the output.

For one embodiment, the CNA encoder 200 is implemented as a software module that may be stored, for example, on machine-accessible medium (media) 215 such as disk-drive, a network-accessible drive, etc. The machine-accessible media 215 may be accessed by a machine 220, such as a computer. The machine 220 may include a processor 223, such as a microprocessor, including an execution unit 225 to execute the software code 200 to provide the described functionality. The netlist or other input 205 and/or the output 210 may also be provided in the form of software file(s) or modules stored on machine accessible medium (media) 215.

For some embodiments, a CNA encryption engine 230 may also be provided as part of the CNA encoder 200 or as a separate module, for example. For such embodiments, the CNA encryption engine 230 may be used to encrypt the CNA 210 or encrypt information to be stored as the CNA 210 using any type of encryption approach. Where encryption is used, the CNA 210 may only be readable by someone or something with access to the appropriate decryption algorithm such that the functionality, features and/or structure of the host integrated circuit that are described by the CNA and that are not otherwise easy to determine may be more securely stored.

A compression engine 235 may also be included for some embodiments, either as part of another module such as the CNA encoder 200, or as a separate module. The compression engine 235 may be used to compress the netlist or other information prior to storage as the CNA on the host integrated circuit such that the CNA may take up less space on the host integrated circuit device.

It will be appreciated that, while machine-accessible media 215 is shown as a single block in FIG. 2, each of the modules 200, 205, 210, 230 and/or 235 may be stored on multiple machine-accessible media and accessed either directly or over a network.

Referring back to FIG. 1, for one embodiment, the self-description data store 110 may be part of a larger data store or data stores 115 that may be used for another purpose. For example, for embodiments for which the integrated circuit 100 is a processor, the data store 115 may be a microcode read-only memory (ROM). Alternatively or additionally, the self-description data store 110 may be implemented using any memory type or mix of memory types available on the host circuit 100 technology that is capable of providing the features described herein.

For other embodiments, the self-description data store 110 may be provided as a standalone memory within the host integrated circuit 100, and/or multiple self-description data stores 110 may be provided for various units, for example, across the integrated circuit device 100.

An input/output (I/O) circuit 120 may also be provided to provide access to the CNA and/or the self-description data store 110 as described in more detail below in reference to FIG. 3.

Storing a CNA on a host integrated circuit in accordance with various embodiments in the manner described above may be advantageous in terms of co-locating device information with the integrated circuit it describes. In this manner, if such an integrated circuit needs to be debugged, simulated or otherwise analyzed documentation and/or information to facilitate the analysis is readily available.

Figure 3:
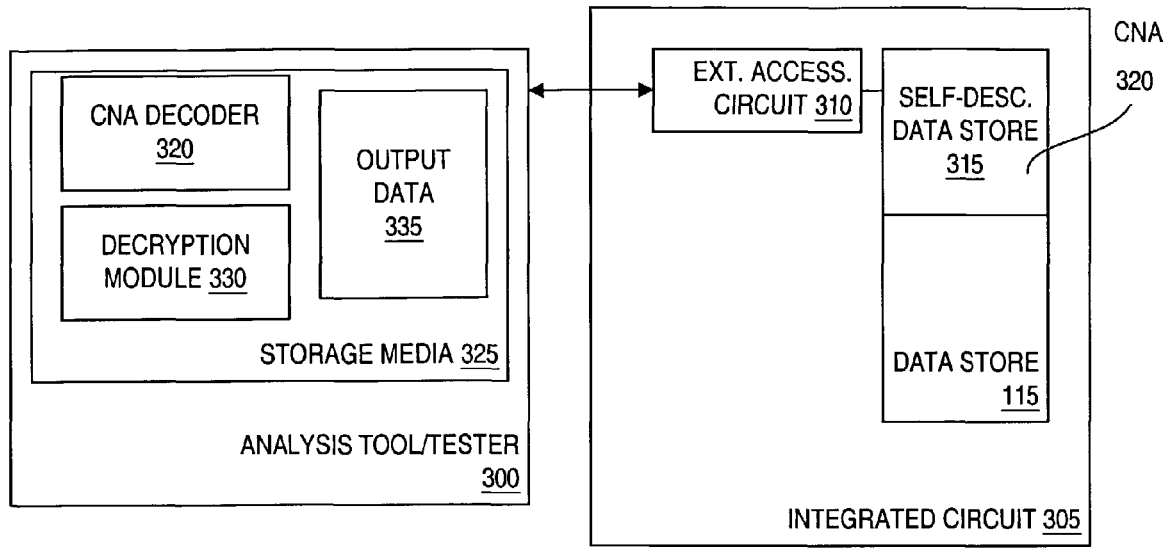
FIG. 3 is a high-level block diagram showing a CNA retrieval approach of one embodiment.

Referring to FIG. 3, for such a situation, to access the CNA for some embodiments, a tester, gate-level circuit simulator or other external machine 300 may be coupled to a host integrated circuit 305 test access port, scan chain or other input/output or externally-accessible circuit 310. A self-description data store 315 storing the CNA 320 may be coupled to the externally-accessible circuit 310 such that the CNA data may be provided through the externally-accessible circuit 310 to the machine 300. For a JTAG (joint test action group)-compliant integrated circuit, for example, if the CNA 320 can be scanned, the CNA content may be shifted off the host integrated circuit chip via a JTAG test access port 310 in a serial manner.

Alternatively, for some embodiments, a dedicated ROM dump circuit 310 may be provided to extract CNA information via standard front side or other bus transactions. Other approaches for transferring the CNA from the host integrated circuit 305 to an external machine or probe 300 are within the scope of various embodiments.

As the CNA data is received at the machine 300, the CNA may be decoded, modeled and/or parsed by a CNA decoder 320. For one embodiment, the decoder 320 may be provided, for example, as a software module stored on storage media 325 that is either coupled to the machine 300 or accessible by the machine 300. Where the CNA is encrypted, a decryption module 330 may also be included in the decoder 320 or otherwise accessible by the machine 300. The decoder 320, alone or in conjunction with the decryption module 330 then provides output data 335 in a form that is usable by the machine or analysis tool 300 to analyze or simulate, for example, the host integrated circuit device 305.

CNA data may be used, for example, to develop targeted tests to discover and analyze bugs, determine test timings, functionality, connections, etc. Other types of data stored in the CNA may be used for a variety of purposes.

Figure 6:
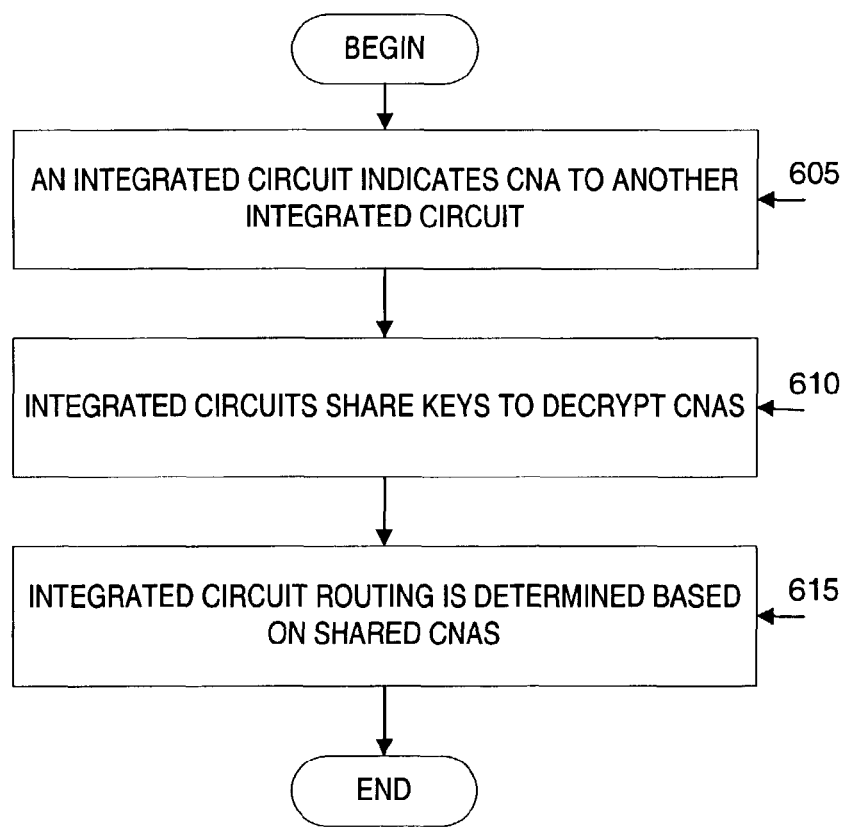
FIG. 6 is a flow diagram illustrating a method of one embodiment for integrated circuit self-organization.

Another possible feature of self-documenting integrated circuits in accordance with various embodiments is the ability to ease the automation of circuit self-organization. Referring to FIG. 6, for circuits that include a CNA as described herein, one complex circuit may indicate to another complex circuit its functionality, organization and other information at block 605. In this manner, automatic integration of multiple complex circuits onto motherboards may be implemented on the basis of their respective CNA contents. Using this exemplary approach, chips may be soldered to the motherboard and the routing between them may then be determined based on the CNAs of the chips. Such an approach may be used to reduce motherboard manufacturing costs.

Where encryption is used as described above, system-level circuits, for example, having netlists that are unknown to designers and users may be manufactured. The CNA contents may be encrypted in such a way that only certain other circuits can decrypt their contents. Several integrated circuits on a motherboard, for example, may share keys such that they can decrypt each other's encrypted CNAs at block 607 and subsequently self-organize so as to create a motherboard having a specified functionality at block 610. Coupled with software encryption, such individually encrypted hardware elements and systems of elements may enhance the security of product designs and may be used to basically provide an encrypted integrated circuit system. In the example described above, it may be much more difficult to reverse-engineer such a system as compared to a conventionally manufactured motherboard.

It will be appreciated that, for some embodiments, not all of the actions shown in FIG. 6 may be included. Further, additional actions may be included for other embodiments.

Additionally, for embodiments for which the CNA describes functionality that the manufacturer may desire to preserve for an unpredicted future use, the CNA of a particular circuit can serve as a reservoir of functionality that the manufacturer may draw upon in the future as a kind of design bank.

Figure 4:
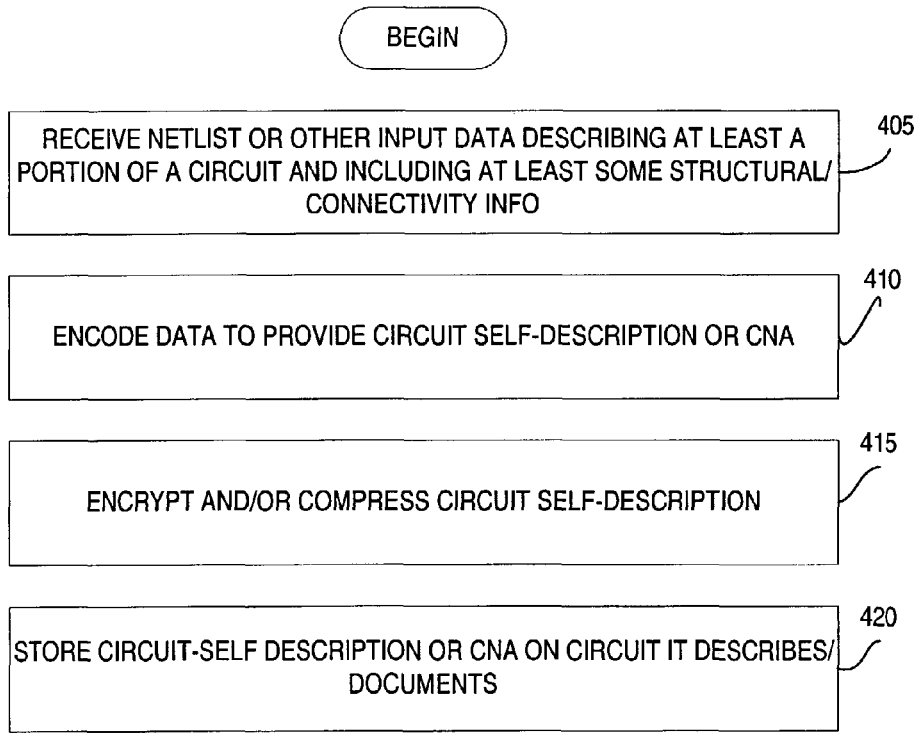
FIG. 4 is a flow diagram illustrating a method of one embodiment for providing an integrated circuit self-description.

Referring to FIG. 4, a method of one embodiment for providing an integrated circuit self-description is described.

At block 405, a netlist or other input data that describes or documents at least a portion of an integrated circuit and includes at least some connectivity or structural data is received. At block 410, the input data is encoded into a format such that the data can later be retrieved and used to analyze the circuit it documents. This encoded data may be referred to as a circuit self-description and/or circuit netlist attachment. At block 415, the circuit self-description may be encrypted and/or compressed to provide an encrypted and/or compressed circuit self-description or circuit netlist attachment. At block 420, a circuit self-description (or compressed and/or encrypted circuit self-description) based on the input data is stored on the integrated circuit it describes or documents.

It will be appreciated that the method described may include additional actions or may not include all of the actions described in reference to FIG. 4. Further, the actions may be performed in a different order than that shown and described in reference to FIG. 4.

Figure 5:
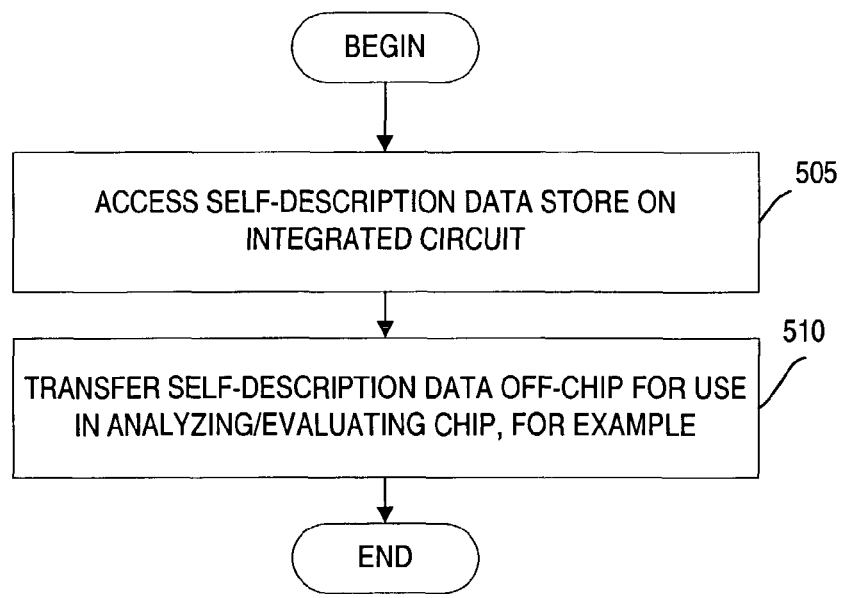
FIG. 5 is a flow diagram illustrating a method of one embodiment for accessing an integrated circuit self-description.

FIG. 5 is a flow diagram showing a method of one embodiment for accessing an integrated circuit self-description stored on the integrated circuit. At block 505, a self-description data store is accessed through an input/output or other externally accessible circuit on the integrated circuit. At block 510, an integrated circuit self-description or circuit netlist attachment (CNA) stored in the self-description data store may be transferred off-chip to be provided, for example, to an external analysis tool or tester for use in analyzing or evaluating the integrated circuit.

It will be appreciated that, for other embodiments, additional actions may be included.

Thus, various embodiments of a self-documenting integrated circuit are described. In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
    an integrated circuit including
        a self-description data store storing a self-description of at least a part of the integrated circuit, the self-description including at least some connectivity information indicating a structure of the part of the integrated circuit, the self-description to be in a form to be used for one of debugging, simulation and analysis of the at least part of the integrated circuit after manufacture of the integrated circuit.

2. The apparatus of claim 1 wherein
    the self-description data store is part of a microcode read-only memory (ROM).

3. The apparatus of claim 1 further comprising
    an externally-accessible circuit, the self-description being accessible via the externally-accessible circuit.

4. The apparatus of claim 3 wherein the externally-accessible circuit is one of a test access port and a scan chain.

5. The apparatus of claim 1 wherein the self-description is encrypted.

6. The apparatus of claim 1 wherein the self-description is compressed.

7. The apparatus of claim 6 wherein the self-description includes a self-description of the self-description.

8. The apparatus of claim 6 further including one of a redundant self-description and a ones complement of the self-description.

9. An apparatus comprising:
    a microcode read-only memory (ROM) provided on an integrated circuit; and
    a circuit netlist attachment (CNA) stored in a portion of the microcode ROM, the CNA including at least some structural and connectivity information associated with the integrated circuit, the CNA to be in a form to be used for one of debugging, simulation and analysis of at least part of the integrated circuit after manufacture of the integrated circuit.

10. The apparatus of claim 9 wherein the CNA is encrypted prior to storage on the integrated circuit.

11. The apparatus of claim 10 wherein the CNA is compressed prior to storage on the integrated circuit.

12. The apparatus of claim 9 wherein the integrated circuit is a microprocessor.

13. The apparatus of claim 9 wherein the integrated circuit further stores a key to decrypt a CNA of another integrated circuit.

14. An apparatus comprising:
    a circuit netlist attachment encoder module to provide a circuit netlist attachment (CNA) in response to receiving input data including at least some connectivity information associated with an integrated circuit; and
    an output to provide the CNA to be stored on the integrated circuit, the CNA to be in a form to be used for one of debugging, simulation and analysis of at least part of the integrated circuit after manufacture of the integrated circuit.

15. The apparatus of claim 14 further comprising:
    a compression module to compress the CNA prior to the CNA being stored on the integrated circuit.

16. The apparatus of claim 14 further comprising:
    an encryption module to encrypt the CNA prior to the CNA being stored on the integrated circuit.

17. The apparatus of claim 16 further comprising:
    a CNA decode module to provide a decoded CNA in response to receiving the CNA from the integrated circuit, the decoded CNA being in a form to be used to analyze the integrated circuit.

18. The apparatus of claim 17 further comprising:
    a decryption module to decrypt the CNA.

19. A method comprising:
    receiving input data associated with an integrated circuit, the input data including at least some connectivity information associated with the integrated circuit; and
    providing a circuit netlist attachment (CNA) describing at least a portion of the integrated circuit in response to receiving the input data, the circuit netlist attachment to be stored on the integrated circuit, the CNA to be in a form to be used for one of debugging, simulation and analysis of the at least a portion of the integrated circuit after manufacture of the integrated circuit.

20. The method of claim 19 further comprising:
    one or more of encrypting and compressing the circuit netlist attachment (CNA) prior to storing the CNA on the integrated circuit.

21. The method of claim 19 further comprising:
    storing the circuit netlist attachment on the integrated circuit.

22. The method of claim 21 wherein storing comprises one of storing at least two copies of the CNA to provide a redundant copy and storing a first copy of the CNA and a ones complement of the CNA on the integrated circuit.

23. The method of claim 19 wherein providing the CNA includes providing a CNA that includes a reference to itself.

24. The method of claim 19 wherein providing the circuit netlist attachment comprises providing the circuit netlist attachment via an externally-accessible circuit on the integrated circuit.

25. The method of claim 19 wherein providing the circuit netlist attachment comprises providing the circuit netlist attachment via one of a scan chain, a test access port and a read-only memory (ROM) dump circuit.

26. The method of claim 19 further comprising:
   providing the circuit netlist attachment to be used by a routing tool to be used in determining a routing on a board between the integrated circuit and another integrated circuit.

* * * * *